US009653346B2

(12) United States Patent
Lin et al.

(10) Patent No.: US 9,653,346 B2
(45) Date of Patent: May 16, 2017

(54) INTEGRATED FINFET STRUCTURE HAVING A CONTACT PLUG PITCH LARGER THAN FIN AND FIRST METAL PITCH

(71) Applicant: UNITED MICROELECTRONICS CORP., Hsin-Chu (TW)

(72) Inventors: Shih-Chin Lin, Hsinchu County (TW); Kuei-Chun Hung, Hsinchu (TW); Jerry Che Jen Hu, Taipei (TW); Ming-Jui Chen, Tainan (TW); Chen-Hsien Hsu, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/800,697

(22) Filed: Jul. 16, 2015

(65) Prior Publication Data

US 2016/0329241 A1  Nov. 10, 2016

Related U.S. Application Data

(60) Provisional application No. 62/158,534, filed on May 7, 2015.

(30) Foreign Application Priority Data

Jun. 11, 2015  (TW) .............................. 104118850 A

(51) Int. Cl.
*H01L 23/522* (2006.01)
*H01L 23/528* (2006.01)
(Continued)

(52) U.S. Cl.
CPC .. *H01L 21/76816* (2013.01); *H01L 21/76877* (2013.01); *H01L 21/76895* (2013.01);
(Continued)

(58) Field of Classification Search
None
See application file for complete search history.

(56) References Cited

U.S. PATENT DOCUMENTS 7,737,554 B2 * 6/2010 Xu ........................ H01L 23/522
257/736
8,399,931 B2  3/2013 Liaw
(Continued)

*Primary Examiner* — Marc Armand
*Assistant Examiner* — Younes Boulghassoul
(74) *Attorney, Agent, or Firm* — Winston Hsu; Scott Margo

(57) ABSTRACT

An integrated circuits structure includes a semiconductor substrate, at least an non-planar field effect transistor (FET) device formed on the semiconductor substrate, and an interconnection structure formed on the semiconductor substrate. The non-planar FET device includes a plurality of fins and a gate electrode. The interconnection structure includes a plurality of first group metals and a plurality of second group metals. The first group metals are formed on the non-planar FET and the second group metals are formed on the first group metals. The first group metals include a first metal pitch and the second group metals include a second metal pitch. The second metal pitch is 1.2-1.5 times to the first metal pitch.

13 Claims, 7 Drawing Sheets

(51) Int. Cl.
*H01L 21/768* (2006.01)
*H01L 29/78* (2006.01)
*H01L 23/535* (2006.01)

(52) U.S. Cl.
CPC ........ *H01L 23/528* (2013.01); *H01L 23/5226* (2013.01); *H01L 23/535* (2013.01); *H01L 29/7851* (2013.01)

(56) References Cited

U.S. PATENT DOCUMENTS

| | | | |
|---|---|---|---|
| 8,728,892 B2* | 5/2014 | Ou | H01L 21/823431 |
| | | | 257/401 |
| 8,799,847 B1 | 8/2014 | Song et al. | |
| 9,099,447 B2 | 8/2015 | Tamaru | |
| 9,117,882 B2* | 8/2015 | Lu | H01L 21/31144 |
| 2001/0017418 A1* | 8/2001 | Noguchi | H01L 23/5222 |
| | | | 257/758 |
| 2002/0036354 A1* | 3/2002 | Yamaguchi | H01L 23/522 |
| | | | 257/775 |
| 2005/0077550 A1 | 4/2005 | Inaba | |
| 2007/0228419 A1 | 10/2007 | Komaki | |
| 2012/0280287 A1 | 11/2012 | Hou | |
| 2013/0113112 A1 | 5/2013 | Tamaru | |
| 2013/0235652 A1 | 9/2013 | Liaw | |
| 2014/0339647 A1* | 11/2014 | Rashed | G06F 17/5072 |
| | | | 257/401 |
| 2016/0049395 A1 | 2/2016 | Okagaki | |
| 2016/0086863 A1 | 3/2016 | Won | |

* cited by examiner

INTEGRATED FINFET STRUCTURE HAVING A CONTACT PLUG PITCH LARGER THAN FIN AND FIRST METAL PITCH

CROSS REFERENCE TO RELATED APPLICATIONS

This patent application claims the benefit under 35 U.S.C. §119(e) of U.S. Provisional Patent Application Ser. No. 62/158,534, which was filed on May 7, 2015. U.S. Provisional Patent Application Ser. No. 62/158,534 is incorporated herein by reference in its entirety.

BACKGROUND OF THE INVENTION

1. Field of the Invention

The present invention relates to an integrated circuit (hereinafter abbreviated as IC) structure and method for forming the same, and more particularly, to an IC structure and method reducing use of multiple patterning process.

2. Description of the Prior Art

Fabrication of microstructures requires tiny elements of precisely controlled size formed in a material layer of an appropriate substrate such as semiconductor substrate/layers, dielectric layers and/or metal layers. These tiny elements are generated by patterning the abovementioned substrate/layers, for instance, by performing photolithography and etching processes. For this purposes, in conventional semiconductor techniques, a mask layer is formed on the material substrate/layers, and these tiny elements are defined in the mask layer and followed by being transferred to the objective material substrate/layers. Generally, the mask layer may include or is formed by means of a layer of photoresist that is patterned by lithographic process and/or patterned hard mask including the patterns transferred from the patterned photoresist. Since the dimensions of the patterns in sophisticated ICs are steadily decreasing, the equipment used for patterning devices features have to meet very stringent requirements with regard to resolution and overlay accuracy of the involved fabrication processes. In this respect, resolution is taken as a measure specifying the consistent ability to print minimum images under conditions of predefined manufacturing variations.

As feature sizes are decreased under 85 nanometers (hereinafter abbreviated as nm), the existing single patterning process has met its bottleneck to successfully render the features. In order to push the lithographic limit further and to create even smaller, more densely packed devices, multiple patterning technology such as double patterning process, are being developed with presently available manufacturing equipment. Typically, the multiple patterning technology is to decompose dense layout patterns into sub-patterns and then use two or more masks to print each sub-pattern. By transferring the sub-patterns to the photoresist layer/mask layer, the wanted patterns are re-constructed and obtained.

It is found that the multiple patterning technology gives rise to process control challenges. Thus, process complexity and process cost are unavoidably increased with the involvement of the multiple patterning technology.

SUMMARY OF THE INVENTION

According to an aspect of the present invention, an IC structure is provided. The IC structure includes a semiconductor substrate, at least an non-planar field effect transistor (hereinafter abbreviated a FET) device formed on the semiconductor substrate, and an interconnection structure formed on the semiconductor substrate. The non-planar FET device includes a plurality of fins and a gate electrode. The interconnection structure includes a plurality of first group metals formed on the non-planar FET device and a plurality of second group metals formed on the first group metals. The first group metals include a first metal pitch, the second group metals includes a second metal pitch, and the second metal pitch is 1.2-1.5 times to the first metal pitch.

According to an aspect of the present invention, a method for forming an IC structure is provided. The method includes following steps. A semiconductor substrate including at least an non-planar FET device formed thereon is provided. A plurality of first group metals are formed on the non-planar FET device. Placements and sizes of the first group metals are defined by a multiple patterning process, and the first group metals include a first metal pitch. A plurality of second group metals are subsequently formed on the first group metals. Placements and sizes of the second group metals are defined by a single patterning process. The second group metals include a second metal pitch, and the second metal pitch is 1.2-1.5 times to the first metal pitch.

According to the IC structure and the method for forming the same provided by the present invention, the first group metals are formed on the non-planar FET and followed by forming the second group metals on the first group metals. More important, the second metal pitch of the second group metals is 1.2-1.5 times to the first metal pitch of the first group metals. Because the placements and the sizes of the second group metals are defined by the single patterning process instead of the multiple patterning process, at least one photomask is saved and at least one lithography alignment step is deleted. Therefore, according to the method for forming the IC structure provided by the present invention, process complexity is reduced, process flow is simplified, and process cost is lowered.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-4 are schematic drawings illustrating a method for forming an IC structure provided by a first preferred embodiment of the present invention, wherein FIG. 3 is a schematic drawing illustrating a modification to the present invention.

FIGS. 1-7 are schematic drawings illustrating a method for forming an IC structure provided by a second preferred embodiment of the present invention.

FIG. 7 is also a schematic drawing illustrating a method for forming an IC structure provided by a third preferred embodiment of the present invention.

DETAILED DESCRIPTION

Conventional planar metal-oxide-semiconductor (MOS) transistor has difficulty when scaling down to 65 nm and beyond. Therefore the non-planar transistor technology such as Fin Field effect transistor (hereinafter abbreviated as FinFET) technology that allows smaller size and higher performance is developed to replace the planar transistor.

Figure 1:
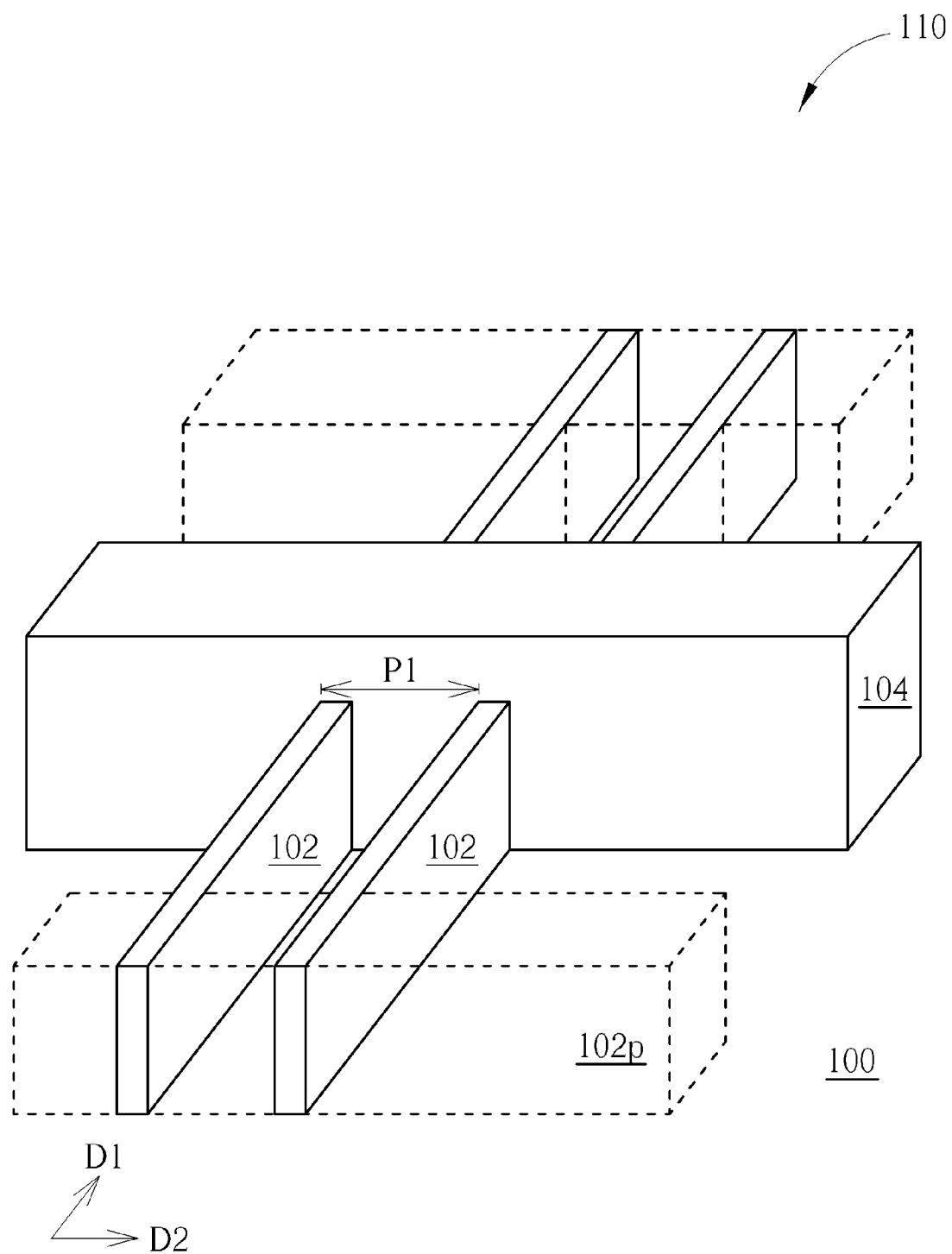

Accordingly, the method for forming an IC structure of the present invention is exemplarily provided to form IC structure including non-planar FET device such as FinFET device, but not limited to this. Please refer to FIGS. 1-4, which are schematic drawings illustrating a method for forming an IC structure provided by a first preferred embodiment of the present invention. As shown in FIG. 1, a semiconductor substrate 100, such as a silicon substrate, is provided. In the preferred embodiment, the semiconductor substrate 100 can include a silicon-on-insulator (SOI) substrate. It is well-known to those skilled in the art that the SOI substrate upwardly includes a silicon substrate, a bottom oxide (BOX) layer, and a semiconductor layer such as a single crystalline silicon layer formed on the BOX layer. Additionally, the semiconductor substrate 100 provided by the preferred embodiment also can include a bulk silicon substrate. Furthermore, the semiconductor substrate 100 provided by the preferred embodiment may include another elementary semiconductor, such as germanium (Ge); a compound semiconductor including silicon carbide (SiC), gallium arsenic (GaAs), gallium phosphide (GaP), indium phosphide (InP), indium arsenide (InAs), and/or indium antimonide (InSb); an alloy semiconductor including SiGe, GaAsP, AlInAs, AlGaAs, GaInAs, GaInP, and/or GaInAsP; or combinations thereof.

Next, a patterned hard mask (not shown) is formed on the semiconductor substrate 100 to define placements and sizes of a plurality of fins for at least an non-planar FET device. In the preferred embodiment, a fin pitch of the fins is smaller than 75 nm. It is known that such fin pitch is beyond the capability of current single exposure lithography system and technology using 193 nm immersion lithography tool, and thus the multiple patterning process, such as a double patterning process is used to form the patterned hard mask defining the placements and the sizes for the fins. In the preferred embodiment, the double patterning process includes a litho-etching-litho-etching (hereinafter abbreviated as LELE) process, a litho-freeze-litho-etch (hereinafter abbreviated as LFLE) process, and a self-aligned double patterning (hereinafter abbreviated as SADP) process (also known as a spacer image transfer (hereinafter abbreviated as SIT) process). After forming the patterned hard mask, an etching process is performed to etch the semiconductor substrate 100 with the patterned hard mask serving as an etching mask, and thus a plurality of fins 102 are formed in the semiconductor substrate 100. Subsequently, the patterned hard mask can be removed or remained on the semiconductor substrate 100 depending on different requirements. Since the fins 102 are formed by etching the semiconductor substrate 100, the fins 102 may include silicon, germanium, III-V semiconductor materials, or aforementioned semiconductor materials. As shown in FIG. 1, the fins 102 include a fin pitch P1, which is defined as the minimum spacing width between the fins 102 plus a fin width. Or, the fin pitch P1 is defined as a minimum distance between a center of one fin 102 and a center of a neighboring fin 102. Also as shown in FIG. 1, the fins 102 are all extended along a first direction D1 and thus are parallel with each other. According to the preferred embodiment, at least a landing pad 102p is selectively formed at ends of the fins 102. Accordingly, the fins 102 are electrically connected to each other by the landing pad 102p as shown in FIG. 1. The landing pad 102p serves as a place for accommodating source/drain contact plug.

After forming the fins 102, a gate electrode 104 is formed on the semiconductor substrate 100. The gate electrode 104, as shown in FIG. 1, crosses the fins 102 and covers a portion of each fin 102. The gate electrode 104 includes a gate dielectric layer (not shown) and a gate conductive layer (not shown). The gate dielectric layer can include includes dielectric material such as silicon oxide (SiO), silicon nitride (SiN), or silicon oxynitride (SiON). In the preferred embodiment, the gate dielectric layer can further include high-K dielectric material such as hafnium oxide (HfO), hafnium silicate (HfSiO), or metal oxide or metal silicate exemplarily of aluminum (Al), zirconium (Zr), lanthanum (La), but not limited to this. Moreover, when the gate dielectric layer includes abovementioned high-k dielectric material, metal gate approach is integrated to the preferred embodiment, therefore a control gate compatible to the high-K gate dielectric layer is obtained. Accordingly, the gate conductive layer includes different materials depending on whether a gate-first process or a gate-last process is adopted. For example, when the gate-first process is adopted, the gate conductive layer can include metals such as tantalum (Ta), titanium (Ti), ruthenium (Ru), molybdenum (Mo), alloys of the aforementioned metals, metal nitride such as tantalum nitride (TaN), titanium nitride (TiN), molybdenum nitride (MoN), or metal carbide such as tantalum carbide (TaC). Since a work function value is associated with the material composition of the metal layer, the material used in the gate conductive layer is chosen to tune its work function value so that a desired threshold voltage Vt for a p type transistor or an n type transistor is achieved. Additionally, the gate conductive layer can include a single work function metal layer or a multiple work function metal layer. When the gate-last process is adopted, the gate conductive layer serves as a dummy gate and thus includes semiconductor material such as a polysilicon.

After forming the gate electrode, other elements such as lightly-doped drains (LDDs), spaces, source/drains are sequentially formed and thus at least a FinFET device 110, that is a non-planar device, is obtained. Additionally, selective strain scheme (SSS) can be used in the preferred embodiment. For example, a selective epitaxial growth (SEG) method can be used to form the source/drain. And salicides (not shown) can be formed on the source/drain. The abovementioned process can be performed in the preferred embodiment if required, but omitted herein in the interest of brevity. Furthermore, in the gate-last process, the dummy gate is removed after other elements are formed and a metal gate including the gate dielectric layer and a work function metal layer is then formed.

Figure 2:
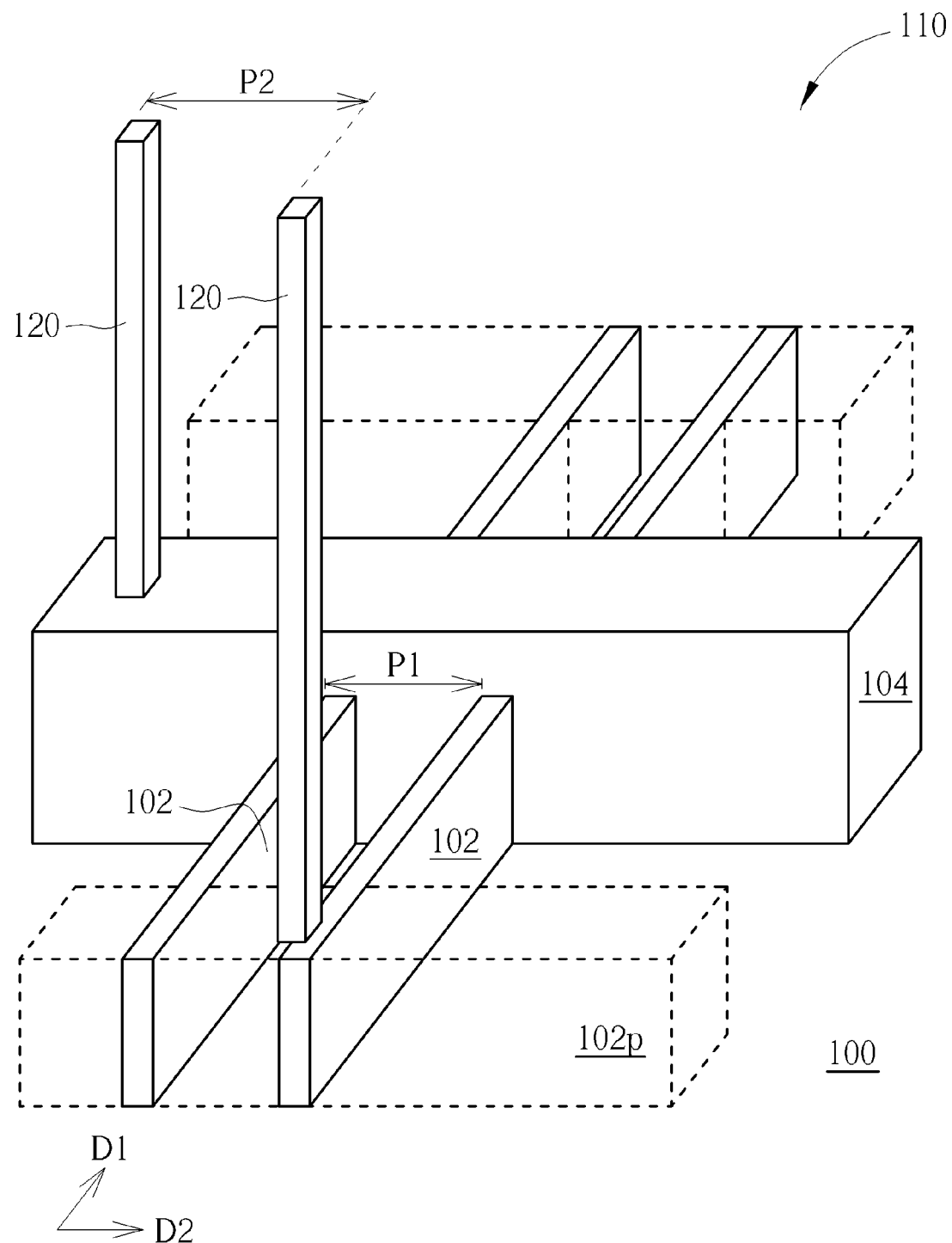

Please refer to FIG. 2. Next, an inter-layer dielectric (hereinafter abbreviated as ILD) layer (not shown) is formed on the semiconductor substrate 100 and followed by forming a plurality of contact plugs 120 in the ILD layer. The contact plugs 120 include a minimum contact pitch P2. It should be understood that in other embodiment of the present invention, the contact pitch P2 can be a gate contact plug-to-gate contact plug contact pitch, a source/drain contact plug-to-source/drain contact plug contact pitch, or a gate contact plug-to-source/drain contact plug contact pitch. Briefly speaking, the contact pitch P2 is used to describe all the contact plugs formed in the ILD layer. Please refer to FIG. 3, which is a schematic drawing illustrating a modification to the present invention. According to the modification, the landing pad 102p can be deleted but a plurality of slot contact plugs 102s are formed in the ILD layer. The slot contact plugs 102s also include the contact pitch P2. It should be noted that for clarifying relationship between the contact plugs 120/the slot contact plugs 102s and the fins 102, the ILD layer is omitted in FIG. 2 and FIG. 3, however those skilled in that art would easily realize existence and placement of the ILD layer.

Please still refer to FIG. 2. In detail, a photolithography process is performed to form a patterned hard mask (not shown) for defining placements and sizes of the contact plugs 120 on the ILD layer. Subsequently, the ILD layer is etched with the patterned hard mask serving as an etching mask. Thus, a plurality of contact openings (not shown) are formed in the ILD layer. A metal layer (not shown) is then formed on the ILD layer and the contact openings are filled up with the metal layer. A planarization process is subsequently performed to remove superfluous metal and thus the contact plugs 120 are formed on the FinFET device 110 in the ILD layer. As mentioned above, the contact plugs 120 include the contact pitch P2, and the contact pitch P2 is defined as the minimum spacing width between the contact plugs 120 plus a plug width. Or, the contact pitch P2 is defined as a minimum distance between a center of one contact plug 120 and a center of a neighboring contact plug 120. As mentioned above, in other embodiments of the present invention, the contact pitch P2 can be a gate contact plug-to-gate contact plug contact pitch, a source/drain contact plug-to-source/drain contact plug contact pitch, or a gate contact plug-to-source/drain contact plug contact pitch. It is noteworthy that in the conventional fabrication process, the contact pitch P2 is usually the same with the fin pitch P1. Therefore, the contact plugs 120 can be formed by the same photolithography process for forming the fins 102. That is, since the conventional contact pitch P2 is usually the same with the fin pitch P1, it is smaller than 75 nm, and thus the single patterning process is not able to successfully render the features. Consequently the multiple patterning process, such as a double patterning process, is used in the conventional fabrication process. However, the contact pitch P2 of the contact pitch P2 is always larger than the fin pitch P1 of the fins 102 according to the preferred embodiment. Preferably, the contact pitch P2 is larger than 75 nm regardless of the fin pitch P1. Therefore, a single patterning process is used in the fabrication of the contact plugs 120 in the preferred embodiment. The single patterning process may include an immersion DUV lithography or E-beam lithography, but not limited to this.

Figure 4:
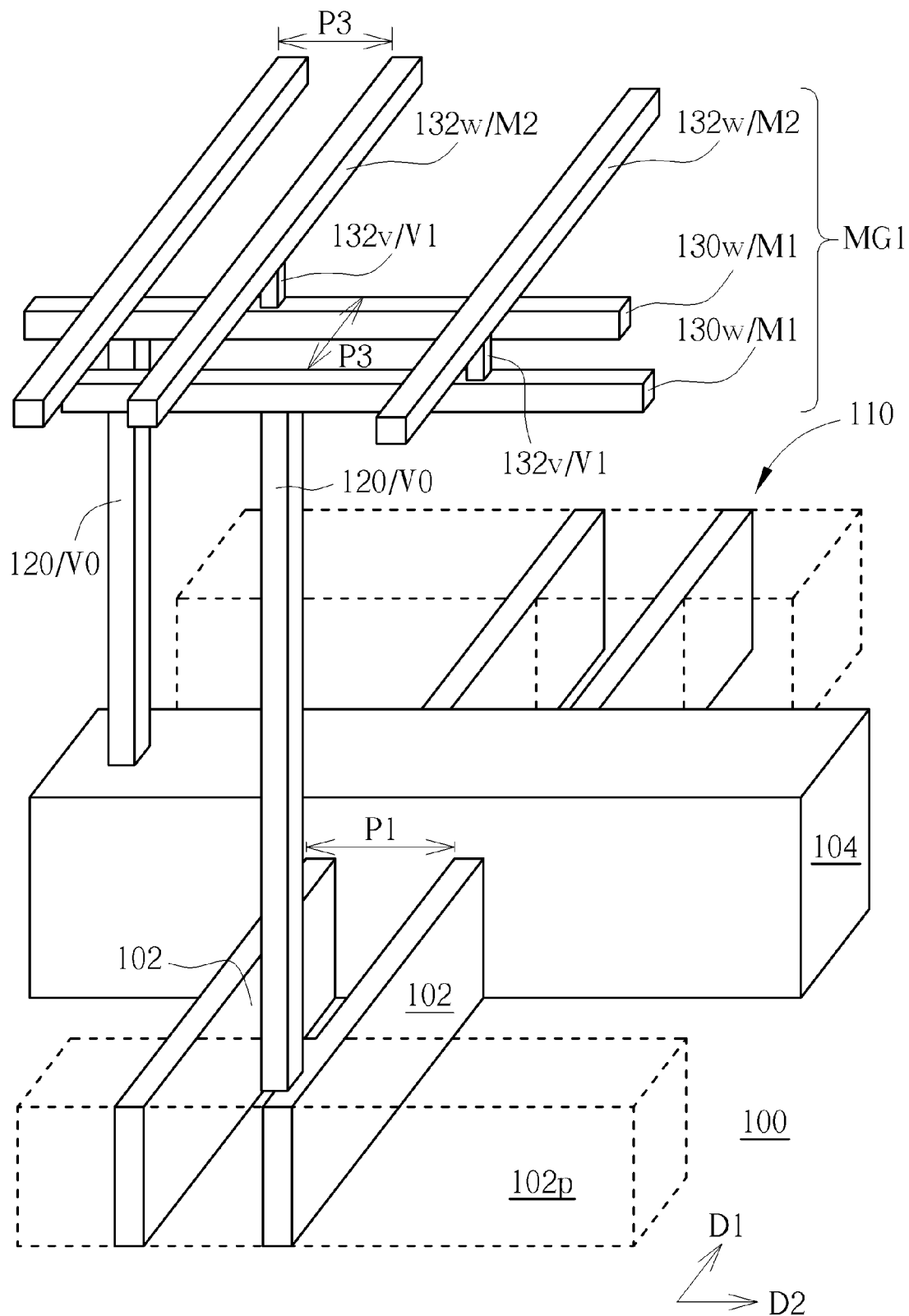

Please refer to FIG. 4. Next, an interconnection structure is formed on the semiconductor substrate 100. For example, a dielectric layer 130d (shown in FIG. 7) is formed on the contact plugs 120 and the ILD layer, and a patterned hard mask (not shown) is formed on the dielectric layer 130d for defining placements and sizes of a plurality of metal structures. The dielectric layer 130d is subsequently etched with the patterned hard mask serving as an etching mask and thus a plurality of metal openings (not shown) are formed in the dielectric layer 130d. Thereafter, a metal layer (not shown) is formed on the dielectric layer 130d, and the metal openings are filled up with the metal layer. A planarization process is then performed to remove superfluous metal and thus a plurality of metal structures 130w are formed in the dielectric layer 130d. In the preferred embodiment, the metal structures 130w are extended along a second direction D2 and thus are parallel with each other. Usually, the second direction D2 is perpendicular to the first direction D1. The metal structures 130w is the bottom/lowest layer of the interconnection structure. It is noteworthy that because the metal structures 130w is the bottom layer (the layer proximal to the FinFET device 110 and the semiconductor substrate 100) of the interconnection structure, the metal structures 130w are taken as first metals M1 of the interconnection structure in the preferred embodiment. Furthermore, the first metals M1 (that are the metal structures 130w) of the interconnection structure are electrically connected to the FinFET device 110 by the contact plugs 120. Therefore the contact plugs 120 are taken as zeroth via plugs V0 in the preferred embodiment. It is noteworthy that, the metal structures 130w includes a metal pitch P3, and the metal pitch P3 is defined as the minimum spacing width between the metal structures 130w plus a width of the metal structures 130w. Or, the metal pitch P3 is defined as a minimum distance between a center of one metal structure 130w and a center of a neighboring metal structure 130w. It should be noted that the metal pitch P3 is the minimum metal pitch for the metal structures 130w in the dielectric layer 130d in accordance with the preferred embodiment. Additionally, since the metal structures 130w are all extended along the second direction D2, the metal pitch P3 is parallel with the first direction D1 as shown in FIG. 4. The metal pitch P3 of the first metals M1 and the fin pitch P1 of the fins 102 conventionally include a ratio, such as 1:1. And the metal pitch-to-fin pitch ratio is adjusted from 1:1 to 3:4. When the scaling factor reaches 22 nm critical dimension, the metal pitch P3 is beyond the capability of current single exposure lithography system and technology. Therefore, the first metals M1 (the metal structures 130w) are formed by a multiple patterning process, such as a double patterning process. The double patterning process can include aforementioned processes and thus those details are omitted for simplicity. Additionally, because the metal structures 130w/the first metals M1 are defined by the double patterning process, it can be formed to extend along the first direction D1 and the second direction D2 after the double patterning process.

Please still refer to FIG. 4. After forming the first metals M1, a dielectric layer 132d (shown in FIG. 7) is formed on the first metals M1 and the dielectric layer 130d, and a patterned hard mask (not shown) is formed on the dielectric layer 132d for defining placements and sizes of a plurality of metal structures and via structures. The dielectric layer 132d is subsequently etched with the patterned hard mask serving as an etching mask, and thus a plurality of metal openings and a plurality of via openings (not shown) are formed in the dielectric layer 132d. Thereafter, a metal layer (not shown) is formed on the dielectric layer 132d, and the metal openings and the via openings are filled up with the metal layer. A planarization process is then performed to remove superfluous metal and thus a plurality of metal structures 132w and a plurality of via structures 132v are formed in the dielectric layer 132d. In the preferred embodiment, the metal structures 132w are extended along the first direction D1 and thus are parallel with each other. The metal structures 132w are taken as second metals M2 of the interconnection structure and the via structures 132v are taken as first via plugs V1 electrically connecting the first metals M1 and the second metals M2. It should be noted that because the second metals M2 (the metal structures 132w) and the first via plugs V1 (the via structures 132v) are both formed in the dielectric layer 132d, the second metals M2 and the first via plugs V1 are taken as one connecting layer. In other words, this connecting layer includes the second metals M2 and the first via plugs V1. However, those skilled in the art would easily realize that the second metals M2 and the first via plugs V1 can be formed in different dielectric layers. Secondly, the metal structures 132w and the via plugs 132v can be formed by performing dual damascene process. Since the dual damascene process is well-known to those skilled in the art, those details are omitted herein in the interest of brevity.

More important, the metal structures 132w also include the metal pitch P3, and the metal pitch P3 is the minimum metal pitch for the metal structures 132w in the dielectric layer 132d. Furthermore, since the metal structures 132w are all extended along the first direction D1, the metal pitch P3 is parallel with the second direction D2 as shown in FIG. 4. According to the preferred embodiment, metal structures 130w/132w including the same metal pitch M3 are categorized to first group metals MG1. Furthermore, the first group metals MG1 can include one connecting layer and no more than two connecting layers. And at least one layer of metal structures among the first group metals MG1 are extended along a direction the same with the fins 102. For example, the second metals M2 of the first group metals MG1 are extended along the first direction D1, which is the same with the fins 102 in accordance with the preferred embodiment.

It is also noteworthy that because the metal pitch P3 of the first group metals MG1 is beyond the capability of current single patterning process and technology, the placements and the sizes of the metal structures 132w are defined by a double patterning process. And another double patterning process is performed to define the placements and the sizes of the via structures 132v.

Figure 5:
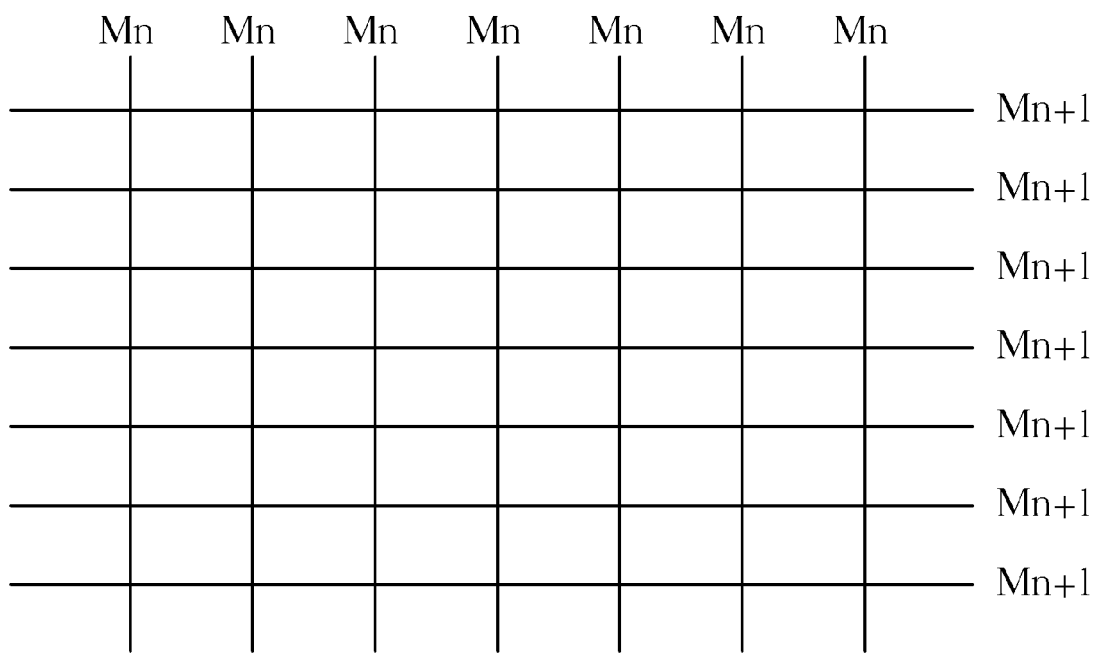
FIG. 5 is a schematic drawing illustrating the interconnection structure provided by the present invention.

Please refer to FIG. 5, which is a schematic drawing illustrating the interconnection structure provided by the present invention. As shown in FIG. 5, an extending direction of any layer of metal structures Mn is perpendicular to extending directions of upper and lower neighboring layers of metal structures Mn+1. For example, the first metals M1 are extending along the second direction D2 while the second metals M2 are extended along the first direction D1 according to the preferred embodiment. It is also noteworthy that since the first group metals MG1 are defined by the double patterning processes, the first metals M1 and the second metals M2 can be formed to extend along the first direction D1 and the second direction D2 after the double patterning process.

According to the IC structure and the method for forming the same provided by the preferred embodiment, after forming the fins 102 by the multiple patterning process in the front-end-of-line, the contact pitch P2 of the contact plugs 120 is increased regardless of the fin pitch P1 of the fins 102. The contact pitch P2 is increased to be within the capability of current single patterning process and technology. Therefore, the contact plugs 120 can be formed by the single patterning process. Furthermore, as mentioned above, the contact pitch P2 can be a gate contact plug-to-gate contact plug contact pitch, a source/drain contact plug-to-source/drain contact plug contact pitch, or a gate contact plug-to-source/drain contact plug contact pitch. Therefore, the contact pitch P2 of the contact plugs 120 is not only larger than the fin pitch P1 of the fins 102, but also larger than the metal pitch P3 of the first group metals MG1 according to the preferred embodiment. In other words, the fire preferred embodiment is to provide a strategy: The placements and the sizes of the fins 102 and the first group metals MG1 are defined by the multiple patterning process, while the placements and the sizes of the contact plugs 120 are defined by the single patterning process. Different from the preferred embodiment, the prior art is to define the placements and the sizes of the contact plugs 120 by the multiple patterning process. Compared with the prior art, at least one mask is saved and at least one alignment step is deleted by the method for forming the IC structure provided by the preferred embodiment. Therefore, according to the method for forming the IC structure provided by the present invention, the process complexity is reduced, the process flow is simplified, and the process cost is lowered.

Please refer to FIGS. 1-7, which are schematic drawings illustrating a method for forming an IC structure provided by a second preferred embodiment of the present invention. It should be noted that elements the same in the first and second preferred embodiments are designated by the same numerals and may include the same material choice, those details therefore are omitted in the interests of brevity. Also, elements the same in the first and second preferred embodiments can be formed by performing the same processes, therefore those details are also omitted for simplicity. As shown in FIG. 1, the preferred embodiment first provides a semiconductor substrate 100, and a multiple patterning process is performed to form a patterned hard mask (not shown) on the semiconductor substrate 100. The semiconductor substrate 100 is then etched to form a plurality of fins 102 with the patterned hard mask serving as etching mask. The fins 102 are parallel with each other. More important, the fins 102 include a fin pitch P1. As mentioned above, since the fin pitch P1 is beyond the capability of the current single patterning process and technology, the multiple patterning process is used to form the fins 102 in the preferred embodiment. The multiple patterning process can include LELE, LFLE, and SADP/SIT, but not limited to this. Subsequently, a gate electrode 104 is formed on the semiconductor substrate 100 and followed by steps for forming at least a FinFET device 110.

Figure 3:
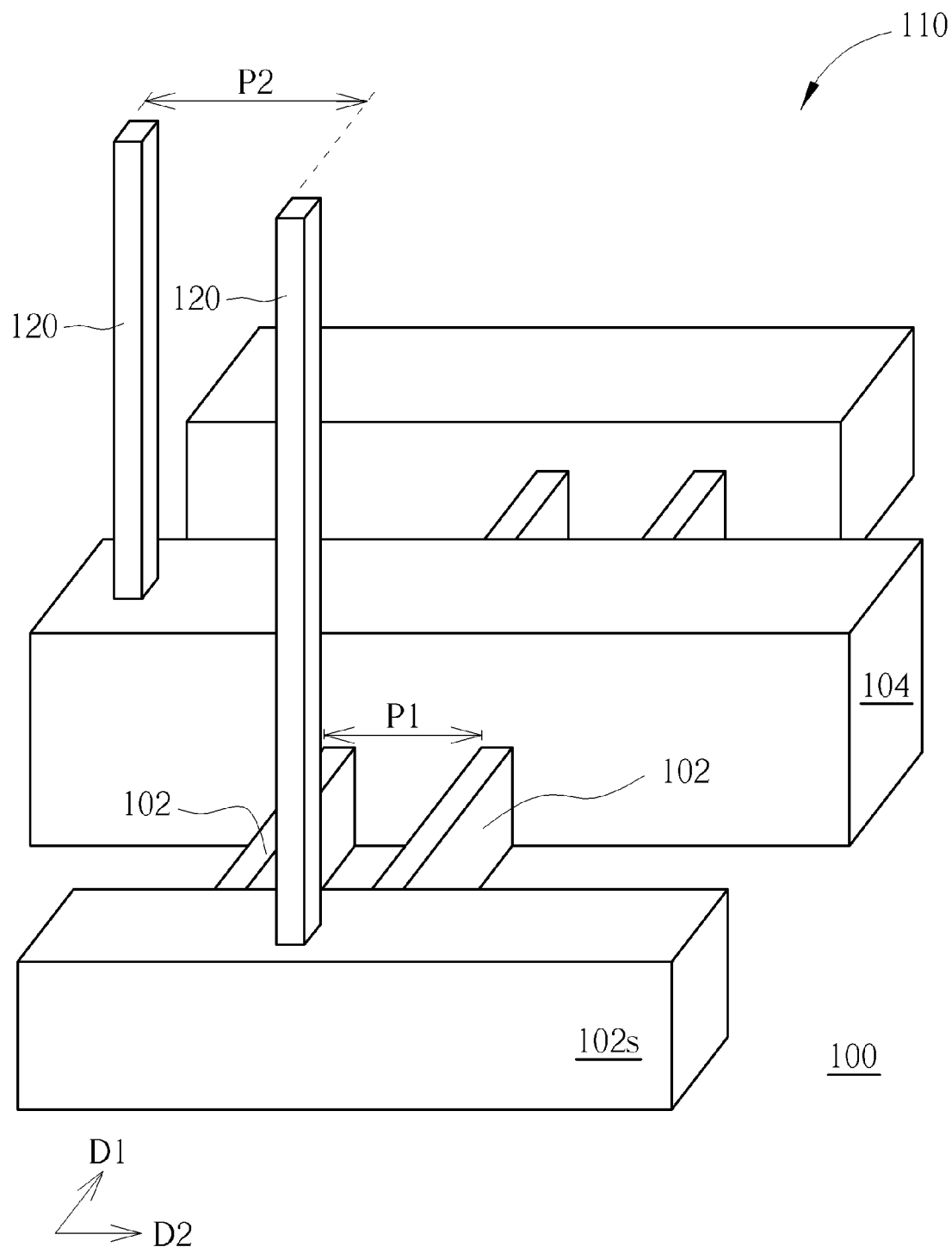

Next, an ILD layer (not shown) is formed on the semiconductor substrate 100. A patterned hard mask (not shown) is then formed on the ILD layer by performing a single patterning process. The ILD layer is etched to form a plurality of contact openings/slot contact openings (not shown) with the patterned mask layer serving as etching mask. As shown in FIGS. 2 and 3, a contact plug 120 is respectively formed in the contact openings. Alternatively, a slot contact 102s is formed in the ILD layer and followed by forming a contact plug 120 electrically connecting the slot contact 102s. The contact plugs 120/slot contact plugs 102s include a contact pitch P2. It should be understood that in other embodiment of the present invention the contact pitch P2 can be a gate contact plug-to-gate contact plug contact pitch, a source/drain contact plug-to-source/drain contact plug contact pitch, or a gate contact plug-to-source/drain contact plug contact pitch. Briefly speaking, the contact pitch P2 is used to describe all the contact plugs formed in the ILD layer. As mentioned in the first preferred embodiment, the contact pitch P2 of the contact plugs 120 is always larger than the fin pitch P1 of the fins 102 according to the preferred embodiment. Preferably, the contact pitch P2 is larger than 75 nm regardless of the fin pitch P1. Therefore, the single patterning process is used in the fabrication of the contact plugs 120 in the preferred embodiment. The single patterning process may include an immersion DUV lithography or E-beam lithography, but not limited to this.

Please refer to FIG. 4. Thereafter, an interconnection structure is formed on the semiconductor substrate 100. For example, a dielectric layer 130d (shown in FIG. 7) is formed on the contact plugs 120 and the ILD layer, and a patterned hard mask (not shown) is formed on the dielectric layer 130d for defining placements and sizes of a plurality of metal structures. The dielectric layer 130d is subsequently etched with the patterned hard mask serving as an etching mask, and thus a plurality of metal openings (not shown) are formed in the dielectric layer 130d. Next, a metal structure 130w is respectively formed in the metal openings as shown in FIG. 4. As mentioned in the first preferred embodiment, the metal structures 130w is the bottom/lowest layer of the interconnection structure. That is, the metal structures 130w forma layer proximal to the FinFET device 110 and the semiconductor substrate 100, thus the metal structures 130w are taken as first metals M1 of the interconnection structure in the preferred embodiment. Furthermore, the first metals M1 of the interconnection structure are electrically connected to the FinFET device 110 by the contact plugs 120. Therefore the contact plugs 120 are taken as zeroth via plugs V0 in the preferred embodiment. It is noteworthy that, the metal structures 130w includes a metal pitch P3, and the metal pitch P3 is the minimum metal pitch for the metal structures 130w in the dielectric layer 130d in accordance with the preferred embodiment. Additionally, since the metal structures 130w are all extended along the second direction D2, the metal pitch P3 is parallel with the first direction D1 as shown in FIG. 4. In the preferred embodiment, the metal pitch P3 is lower than 75 nm and therefore is beyond the capability of current single exposure lithography system and technology. Thus, the first metals M1 are formed by a multiple patterning process, such as a double patterning process. The double patterning process can include aforementioned processes and thus those details are omitted for simplicity. Additionally, because the first metals M1 are defined by the double patterning process, the first metals M1 can be formed to extend along the first direction D1 and the second direction D2 after the double patterning process.

Please still refer to FIG. 4. After forming the first metals M1, a dielectric layer 132d (shown in FIG. 7) is formed on the first metals M1 and the dielectric layer 130d, and a patterned hard mask (not shown) is formed on the dielectric layer 132d for defining placements and sizes of a plurality of metal structures and via structures. The dielectric layer 132d is subsequently etched with the patterned hard mask serving as an etching mask, and thus a plurality of metal openings and a plurality of via openings (both not shown) are formed in the dielectric layer 132d. Thereafter, a metal structure 132w is respectively formed in the metal openings and a via structure 132v is respectively formed in the via openings. In the preferred embodiment, the metal structures 132w are extended along the first direction D1 and thus are parallel with each other. The metal structures 132w are taken as second metals M2 of the interconnection structure and the via structures 132v are taken as first via plugs V1 electrically connecting the first metals M1 and the second metals M2 in the preferred embodiment. It should be noted that because the second metals M2 (the metal structures 132w) and the first via plugs V1 (the via structures 132v) are both formed in the dielectric layer 132d, the second metals M2 and the first via plugs V1 are taken as one connecting layer. In other words, this connecting layer includes the second metals M2 and the first via plugs V1. However, those skilled in the art would easily realize that the second metals M2 and the first via plugs V1 cam be formed indifferent dielectric layers. As mentioned in the first preferred embodiment, the metal structures 132w and the via plugs 132v can be formed by performing dual damascene process. Since the dual damascene process is well-known to those skilled in the art, those details are omitted herein in the interest of brevity. More important, the metal structures 132w include the metal pitch P3, and the metal pitch P3 is the minimum metal pitch for the metal structures 132w in the dielectric layer 132d. The via structures 132v also include the metal pitch P3. As mentioned above, since the metal structures 132w are all extended along the first direction D1, the metal pitch P3 is parallel with the second direction D2 as shown in FIG. 4. According to the preferred embodiment, the metal structures 132w and the via structures 132v of the second metals M2 and the first metals M1 all include the metal pitch P3, therefore the second metals M2, the first via plugs V1 and the first metals M1 are categorized to first group metals MG1. In the preferred embodiment, the first group metals MG1 can include one connecting layer and no more than two connecting layers. At least one layer of the metal structures among the first group metals MG1 are extended along a direction the same with the fins 102. For example, the second metals M2 of the first group metals MG1 are extended along the first direction D1, which is the same with the fins 102 in accordance with the preferred embodiment.

It is also noteworthy that because the metal pitch P3 of the first group metals MG1 is beyond the capability of current single patterning process and technology (75 nm), the placements and the sizes of the metal structures 132w are defined by a double patterning process. And another double patterning process is performed to define the placements and the sizes of the via structures 132v. Furthermore, since the first group metals MG1 are defined by the double patterning processes, the first metals M1 and the second metals M2 can be formed to extend along the first direction D1 and the second direction D2 after the double patterning process.

Figure 6:
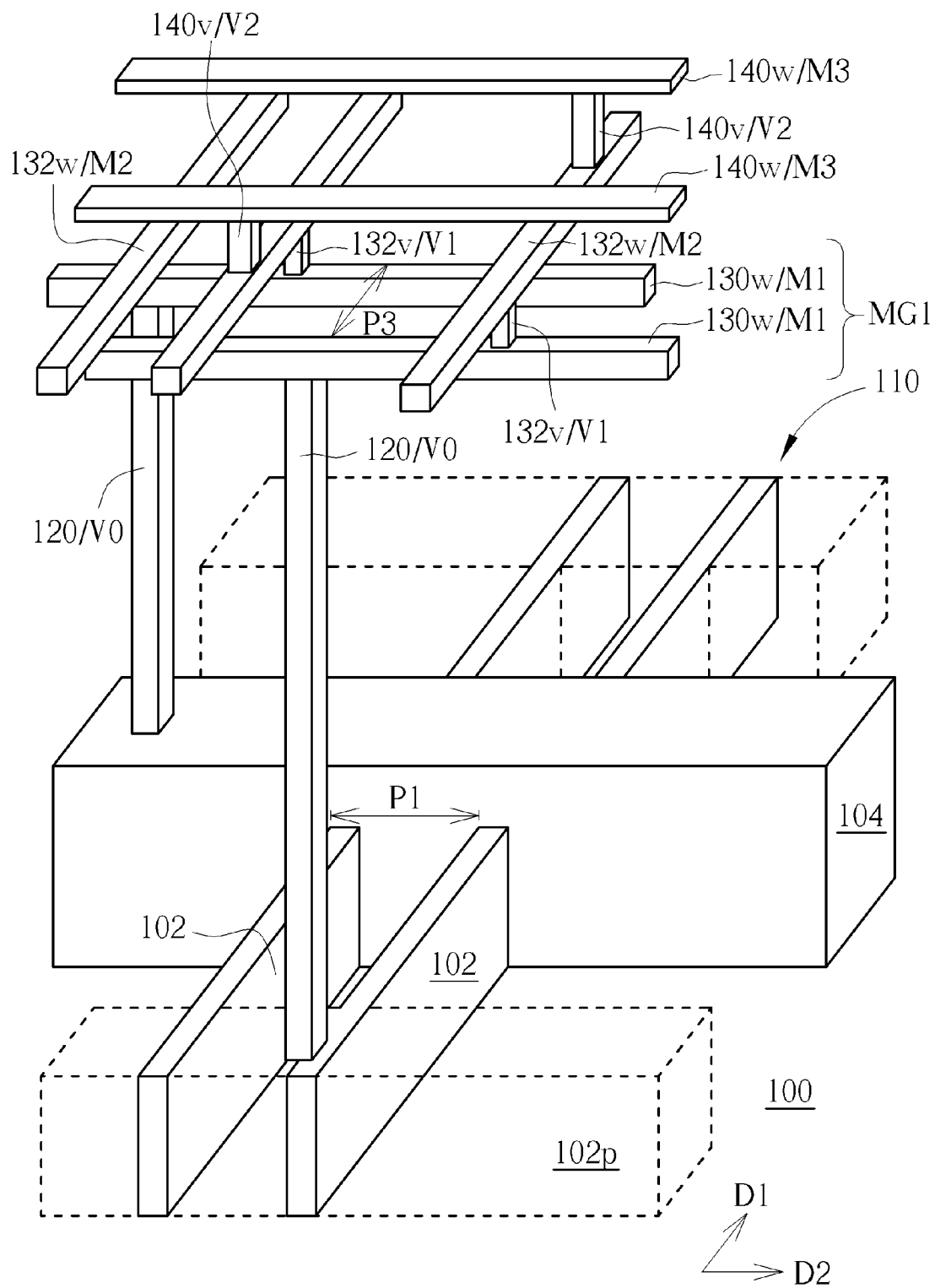
Figure 7:
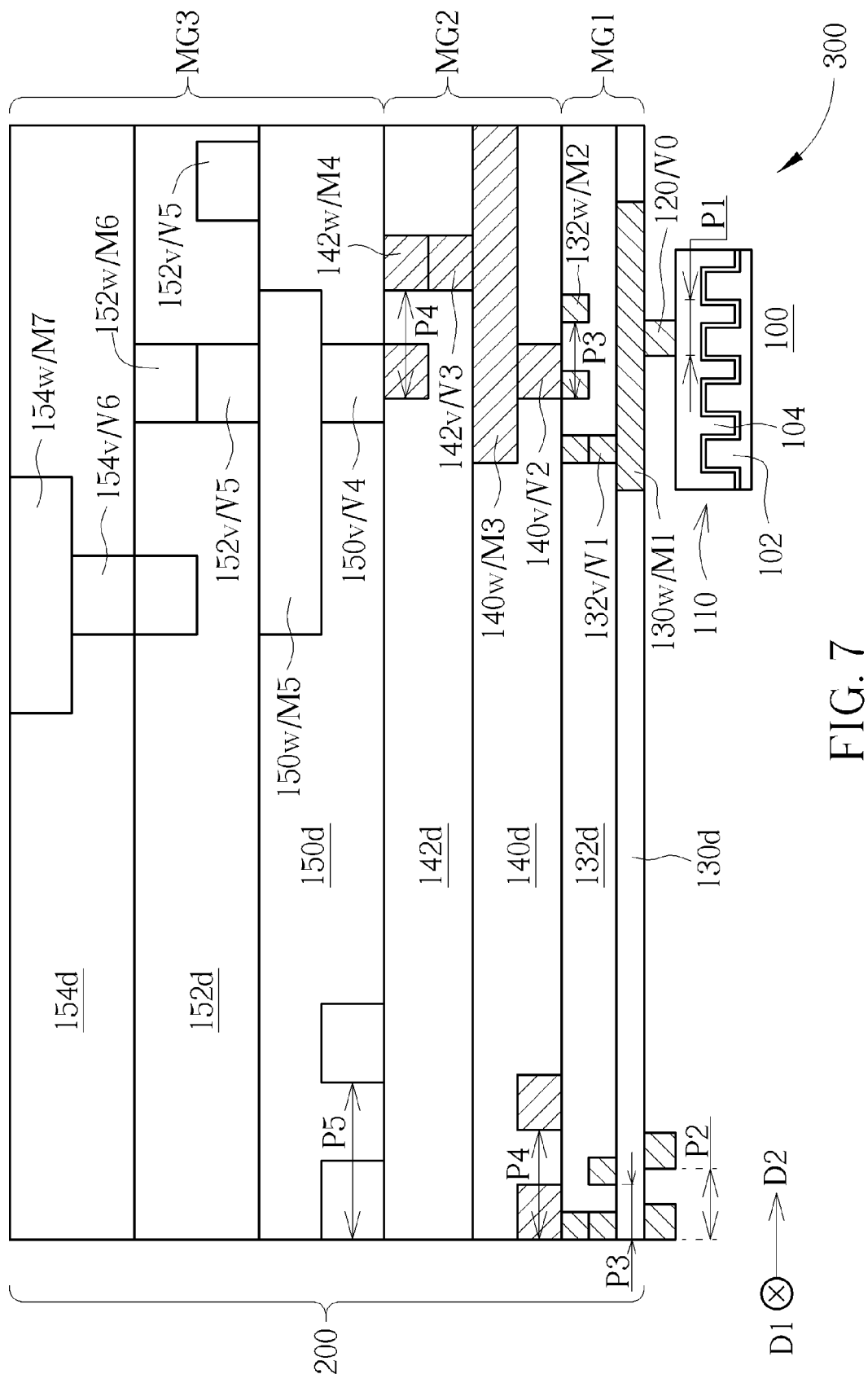

Please refer to FIG. 6. After forming the first group metals MG1, other elements of the interconnection structure are fabricated. As shown in FIGS. 6 and 7, a dielectric layer 140d (shown in FIG. 7) is formed on the first group metals MG1 and the dielectric layer 132d, and a patterned hard mask (not shown) is formed on the dielectric layer 140d for defining placements and sizes of a plurality of metal structures and via structures. The dielectric layer 140d is subsequently etched with the patterned hard mask serving as an etching mask, and thus a plurality of metal openings and a plurality of via openings (not shown) are formed in the dielectric layer 140d. Thereafter, a metal layer (not shown) is formed on the dielectric layer 140d, and the metal openings and the via openings are filled up with the metal layer. A planarization process is then performed to remove superfluous metal and thus a plurality of metal structures 140w and a plurality of via structures 140v are formed in the dielectric layer 140d. In the preferred embodiment, the metal structures 140w are extended along the second direction D2 and thus are parallel with each other. The metal structures 140w are taken as third metals M3 of the interconnection structure and the via structures 140v are taken as second via plugs V2 electrically connecting the second metals M2 and the third metals M3 in the preferred embodiment. As shown in FIGS. 6 and 7, the third metals M3 (the metal structures 140w) and the second via plugs V2 (the via structures 140v) are both formed in the dielectric layer 140d, therefore the third metals M3 and the second via plugs V2 are taken as one connecting layer. In other words, this connecting layer includes the third metals M3 and the second via plugs V2. However, those skilled in the art would easily realize that the third metals M3 and the second via plugs V2 can be formed in different dielectric layers. The metal structures 140w and the via plugs 140v can be formed by performing dual damascene process. Since the dual damascene process is well-known to those skilled in the art, those details are omitted herein in the interest of brevity. More important, the metal structures 140w include a metal pitch P4, and the via plugs 140v also include the metal pitch P4. In the preferred embodiment, the metal pitch P4 is the minimum metal pitch for the metal structures 140w in the dielectric layer 140d. Furthermore, since the metal structures 140w are all extended along the second direction D2, the metal pitch P4 is parallel with the first direction D1 as shown in FIG. 6. The metal pitch P4 of the metal structures 140w and the via plugs 140v is 1.2-1.5 times to the metal pitch P3 of the first metals M1. In the preferred embodiment, the metal pitch P4 of the metal structures 140w and the via plugs 140 is between 75 nm and 85 nm, but not limited to this.

Please refer to FIG. 7. Next, steps of forming a dielectric layer 142d, forming a the patterned hard mask on the dielectric layer 142d by a photolithograph process, etching the dielectric layer 142d to form a plurality of metal openings and a plurality of via openings in the dielectric layer 142d through the patterned hard mask, and forming a metal structure 142w respectively in the metal openings and a via structure 142v respectively in the via openings are performed. The metal structures 142w are taken as fourth metals M4 of the interconnection structure and the via structures 142v are taken as third via plugs V3 electrically connecting the third metals M3 and the fourth metals M4 in the preferred embodiment. As shown in FIG. 7, because the fourth metals M4 and the third via plugs V3 are both formed in the dielectric layer 142d, the fourth metals M4 and the third via plugs V3 are taken as one connecting layer. In other words, this connecting layer includes the fourth metals M4 and the third via plugs V3. However, those skilled in the art would easily realize that the fourth metals M4 and the third via plugs V3 can be formed in different dielectric layers. It is noteworthy that the metal structures 142w and the via structures 142v include a metal pitch P4, and the metal pitch P4 is the minimum metal pitch for the metal structures 142w in the dielectric layer 142d. As mentioned above, the metal structures 142w are all extended along the first direction D1, therefore the metal pitch P4 is parallel with the second direction D2 as shown in FIG. 7. According to the preferred embodiment, metal structures including the same metal pitch P4 are categorized to a second group metals MG2. More important, the metal pitch P4 of the second group metals MG2 is 1.2-1.5 times to the metal pitch P3 of the first group metals MG1. For example, in the preferred embodiment, the metal pitch P4 of the second group metals MG2 is between 75 nm and 85 nm, but not limited to this. Additionally, these abovementioned steps can be repeated any number of times to form the stacked structure of the interconnection structure. Therefore the second group metals MG2 can include not only two connecting layers as shown in FIGS. 6 and 7. Particularly, the second group metals MG2 can include no more than four connecting layers.

It is also noteworthy that because the metal pitch P4 of the second group metals MG2 is within the capability of current single patterning process and technology, the placements and the sizes of the metal structures are defined by a single patterning process. And another single patterning process is performed to define the placements and the sizes of the via structures.

Please still refer to FIG. 7. After forming the second group metals MG2, other elements of the interconnection structure are fabricated. As shown in FIG. 7, a dielectric layer 150d/152d/154d is formed. The dielectric layer 150d/152d/154d respectively can include multi-layered dielectric materials. A patterned hard mask (not shown) is formed on the dielectric layer 150d/152d/154d for defining placements and sizes of a plurality of metal structures and via structures. The dielectric layer 150d/152d/154d is subsequently etched with the patterned hard mask serving as an etching mask, and thus a plurality of metal openings and a plurality of via openings (not shown) are formed in the dielectric layer 150d/152d/154d. Thereafter, a metal layer (not shown) is formed on the dielectric layer 150d/152d/154d, and the metal openings and the via openings are filled up with the metal layer. A planarization process is then performed to remove superfluous metal and thus a plurality of metal structures 150w/152w/154w and a plurality of via structures 150v/152v/154v are formed in the dielectric layer 150d/152d/154d. The metal structures 150w are taken as fifth metals M5 of the interconnection structure, and the via structures 150v are taken as fourth via plugs V4 for electrically connecting the fifth metals M5 and the fourth metals M4. In the concept, the metal structures 152w are taken as sixth metals M6, the via structures 152v are taken as fifth via plugs V5, the metal structures 154w are taken as seventh metals M7, and the via structures 154v are taken as sixth via plugs V6. As shown in FIG. 7, the fifth metals M5 and the fourth via plugs V4 are formed in the same dielectric layer 150d, therefore the fifth metals M5 and the fourth via plugs V4 are taken as one connecting layer. The sixth metals M6 and the fifth via plugs V5 are formed in the same dielectric layer 152d, therefore the sixth metals M6 and the fifth via plugs V5 are taken as one connecting layer. The seventh metals M7 and the sixth via plugs V6 are formed in the same dielectric layer 154d, therefore the seventh metals M7 and the sixth via plugs V6 are taken are one connecting layer. It is therefore concluded that each layer of the interconnection structure includes the Mn metals and the Vn−1 via plugs. More important, the metal structures 150w/152w/154w and the via structures 150v/152v/154v all include a metal pitch P5. The metal pitch P5 is the minimum metal pitch for the metal structures 150w/152w/154w in the dielectric layer 150d/152d/154d. By performing the abovementioned steps, an interconnection structure 200 and an IC structure 300 are obtained.

Furthermore, as shown in FIGS. 5 and 7, an extending direction of any layer of metal structures Mn is perpendicular to extending directions of upper and lower neighboring layers of metal structures Mn+1.

According to the IC structure 300 and the method for forming the same provided by the preferred embodiment, after forming the fins 102 by the multiple patterning process in the front-end-of-line, the contact pitch P2 of the contact plugs 120 is increased regardless of the fin pitch P1 of the fins 102. The contact pitch P2 is increased to be within the capability of current single patterning process and technology. Therefore, the contact plugs 120 can be formed by performing the single patterning process. As mentioned above, the contact pitch P2 can be a gate contact plug-to-gate contact plug contact pitch, a source/drain contact plug-to-source/drain contact plug contact pitch, or a gate contact plug-to-source/drain contact plug contact pitch. More important, the preferred embodiment is to limit that the first group metals MG1, which are formed by the multiple patterning process, includes no more than two connecting layers. The preferred embodiment further provides the second group metals MG2 formed on the first group metals MG1, and the second group metals MG 2 are defined by the single patterning process. In detail, the metal pitch P3 of the first group metals MG1 is smaller than a predetermined value, and the predetermined value is 75 nm. The metal pitch P4 of the second group metals MG2 is 1.2-1.5 times to the metal pitch P3 of the first group metals MG1. For example but not limited to, the metal pitch P4 of the second group metals MG2 is between 75 nm and 85 nm. Because the metal pitch P4 of the second group metals MG2 is within the capability of the single patterning process and technology, the single patterning process is used in the second group metals MG2 fabrication. In other words, the preferred embodiment is to define the placements and the sizes of the fins 102 by the multiple patterning process, to define the placements and the sizes of the contact plugs 120 by the single patterning process, to define the placements and the sizes of the first group metals MG1 by the multiple patterning process, and to define the placements and the sizes of the second group metals MG2 by the single patterning process, sequentially. Compared with the prior art, which is to define the placements and the sizes of the contact plugs 120 and the second group metals MG2 by the multiple patterning processes, at least two photomasks are saved in accordance with the method provided by the preferred embodiment. It is found that since at least two photomasks are saved in fabrication for each connecting layer of the second group metals MG2, the more connecting layers the second group metals MG2 includes, the more photomasks are saved in the back-end-of-line (BEOL) procedures. Therefore, according to the method for forming the IC structure provided by the present invention, the process complexity is reduced, the process flow is simplified, and the process cost is lowered.

Please still refer to FIG. 7 again, which is also a schematic drawing illustrating an IC structure provided by a third preferred embodiment of the present invention. It should be noted that elements the same in the first and third preferred embodiments are designated by the same numerals and include the same material choice, those details therefore are omitted in the interests of brevity. Also, elements the same in the first and third preferred embodiments can be formed by performing the same processes, therefore those details are also omitted for simplicity. As shown in FIG. 7, the preferred embodiment first provides a semiconductor substrate 100, and at least an non-planar FET device such as a FinFET device 110 is formed on the semiconductor substrate 100. The FinFET device 110 includes a plurality of fins 102 arranged along a first direction D1, and a gate electrode 104 covering a portion of each fin 102. Next, an ILD layer (not shown) is formed on the semiconductor substrate 100, and a plurality of contact plugs 120 or a plurality of slot contacts plugs 102s are formed in the ILD layer.

After forming the contact plugs 120 and/or the slot contacts 102s, an interconnection structure 200 is formed on the semiconductor substrate 100. In detail, a dielectric layer 130d is formed on the contact plugs 120 and the ILD layer, and a patterned hard mask (not shown) is formed on the dielectric layer 130d for defining placements and sizes of a plurality of metal structures. The dielectric layer 130d is subsequently etched with the patterned hard mask serving as an etching mask, and thus a plurality of metal openings (not shown) are formed in the dielectric layer 130d. Next, a metal structure 130w is respectively formed in the metal openings as shown in FIG. 7. As mentioned above, the metal structures 130w is taken as first metals M1 of the interconnection structure 200. Furthermore, the first metals M1 of the interconnection structure 200 are electrically connected to the FinFET device 110 by the contact plugs 120. Therefore the contact plugs 120 are taken as zeroth via plugs V0 in the preferred embodiment. After forming the first metals M1, steps for forming the dielectric layer 132d, the second metals M2 and the first via plugs V1 are performed as mentioned above. Since the second metals M2 and the first via plugs V1 are both formed in the same dielectric layer 132d, the second metals M2 and the first via plugs V1 are taken as one connecting layer. In other words, this connecting layer includes the second metals M2 and the first via plugs V1. As mentioned above, the second metals M2 and the first via plugs V1 can be formed by performing dual damascene process. Since the dual damascene process is well-known to those skilled in the art, those details are omitted herein in the interest of brevity. More important, the first metals M1, the first via plugs V1, and the second metals M2 all include a metal pitch P3. Thus, the first metals M1, the first via plugs V1, and the second metals M2 are categorized to first group metals MG1. Furthermore, in the preferred embodiment, the first group metals MG1 can include no more than two connecting layers. As shown in FIG. 7, at least one layer of metal structures among the first group metals MG1 are extended along a direction the same with the fins 102. For example, the second metals M2 of the first group metals MG1 are extended along the first direction D1, which is the same with the fins 102 in accordance with the preferred embodiment.

More important, the metal pitch P3 of the first group metals MG1 in the preferred embodiment is not only beyond the capability of the current single patterning process and technology (75 nm), but also beyond the capability of current double patterning process and technology (50 nm). Therefore, a quadruple patterning process is required for forming the first group metals MG1 in the preferred embodiment. Additionally, the second metals M2 are formed by a quadruple patterning process while the first via plugs V1 are form by another quadruple patterning process. Briefly speaking, two quadruple patterning processes are required to form the metal/via structures in one dielectric layer.

Please still refer to FIG. 7. After forming the first group metals MG1, other elements of the interconnection structure 200 are fabricated. As shown in FIG. 7, a dielectric layer 140d is formed on the first group metals MG1, and a patterned hard mask (not shown) is formed on the dielectric layer 140d for defining placements and sizes of a plurality of metal structures and via structures. The dielectric layer 140d is subsequently etched with the patterned hard mask serving as an etching mask and thus a plurality of metal openings and a plurality of via openings (not shown) are formed in the dielectric layer 140d. Thereafter, the third metals M3 are respectively formed in the metal openings and the second via plugs V2 are respectively formed in the via openings. The above mentioned steps can be repeated such that a dielectric layer 142d is formed on the dielectric layer 140d, and the fourth metals M4 and the third via plugs V3 are formed in the dielectric layer 142d. It is noteworthy that the third metals M3, the second via plugs V2, the fourth metals M4, and the third via plugs V3 all include a metal pitch P4. Therefore the third metals M3, the second via plugs V2, the fourth metals M4, and the third via plugs V3 are categorized to second group metals MG2. More important, the metal pitch P4 of the second group metals MG2 is 1.2-1.5 times to the metal pitch P3 of the first group metals MG1. According to the preferred embodiment, the metal pitch P4 of the second group metals MG2 is between 50 nm and 75 nm, but not limited to this. Additionally, these abovementioned steps can be repeated such that the second group metals MG2 can include not only 2 connecting layers as shown in FIG. 7. Specifically, the second group metals MG2 includes no more than 4 connecting layers.

It should be noted that though the metal pitch P4 of the second group metals MG2 is within the capability of the quadruple patterning process and technology, it is still beyond the capability of the current single patterning process and technology. Therefore, each connecting layer of the second group metals MG2 requires two double patterning processes: one for defining the placements and the sizes of the metal structures, and the other for defining the placements and the sizes of the via structures.

Please still refer to FIG. 7. After forming the second group metals MG2, other elements of the interconnection structure 200 are fabricated. As shown in FIG. 7, a dielectric layer 150d/152d/154d is formed and followed by forming a patterned hard mask (not shown) on the dielectric layer 150d/152d/154d for defining placements and sizes of a plurality of metal structures and via structures. The dielectric layer 150d/152d/154d is subsequently etched with the patterned hard mask serving as an etching mask, and thus a plurality of metal openings and a plurality of via openings (not shown) are formed in the dielectric layer 150d/152d/154d. Thereafter, metal structures are respectively formed in the metal openings and via structures are respectively formed in the via openings. As shown in FIG. 7, the fifth metals M5 and the fourth via plugs V4 are formed in the dielectric layer 150d, the sixth metals M6 and the fifth via plugs V5 are formed in the dielectric layer 152d, and the seven metals M7 and the sixth via plugs V6 are formed in the dielectric layer 154d. It is concluded that each layer of the interconnection structure includes the Mn metals and the Vn−1 via plugs. More important, the metals M5/M6/M7 and via plugs V4/V5/V6 all include a metal pitch P5, and thus the metals M5/M6/M7 and via plugs V4/V5/V6 are categorized to third group metals MG3. The metal pitch P5 of the third group metals MG3 is 1.2-1.5 times to the metal pitch P4 of the second group metals MG2. In the preferred embodiment, the metal pitch P4 of the second group metals MG2 is larger than 75 nm, but not limited to this.

It should be noted that the metal pitch P5 of the third group metals MG3 is within the capability of the single patterning process and technology, therefore, each connecting layer of the third group metals MG3 requires two single patterning processes: one for defining the placements and the sizes of the metal structures, and the other for defining the placements and the sizes of the via structures.

According to the IC structure and the method for forming the same provided by the preferred embodiment, the metal pitch P3 of the first group metals MG1 is smaller than a first predetermined value, the metal pitch P4 of the second group metals MG2 is larger than the first predetermined value but smaller than a second predetermined value, and the metal pitch P5 of the third group metals MG3 is larger than the second predetermined value. The first predetermined value and the second predetermined value respectively defines resolution limits of different photolithography systems. For example, the first predetermined value is 50 nm and the second predetermined value is 75 nm in the preferred embodiment, but not limited to this. Accordingly, the first group metals MG1, which includes the metal pitch P3 smaller than 50 nm, require the quadruple patterning processes; the second group metals MG2, which includes the metal pitch P4 between 50 nm and 75 nm, require the double patterning processes; and the third group metals MG3, which include the metal pitch P5 larger than 75 nm, require the single patterning processes. Briefly speaking, the preferred embodiment is to define the first group metals MG1 by high-level photolithography apparatus, to define the second group metals MG2 by a sub-level photolithography apparatus, and to define the third group metals MG3 by a further sub-level photolithography apparatus.

According to the IC structure and the method for forming the same provided by the preferred embodiment, the contact pitch of the contact plugs/slot contact plugs is increased to be larger than fin pitch of the fins or the metal pitch of the first group metals. And the contact plugs/slot contact plugs are defined by the single patterning process instead of the multiple patterning process, which is conventionally used in the prior art. Therefore, at least one photomask and one alignment step are saved when forming the contact plugs/slot contact plugs. Furthermore, the present invention is to form the first group metals on the non-planar FET device and to form the second group metals on the first group metals. The second metal pitch of the second group metals is 1.2-1.5 times to the first metal pitch of the first group metals. Because the second group metals are defined by the single patterning process instead of the multiple patterning process, at least one photomask and one alignment step are saved when forming the second group metals. Briefly speaking, the present invention is to define the placements and the sizes of the first group metals by high-level photolithography apparatus, and to define the placements and the sizes of the second group metals by a sub-level photolithography apparatus. Therefore, the amount of photomask can be decreased. Consequently, according to the method for forming the IC structure provided by the present invention, the process complexity is reduced, the process flow is simplified, and the process cost is lowered.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated circuit (IC) structure comprising:
   a semiconductor substrate;
   at least a non-planar field effect transistor (FET) device formed on the semiconductor substrate, the non-planar FET device comprising a plurality of fins and a gate electrode, and the fins comprising a fin pitch;
   an interconnection structure formed on the semiconductor substrate, the interconnection structure comprising a plurality of first group metals and a plurality of second group metals, the first group metals being formed on the non-planar FET device and the second group metals being formed on the first group metals, the first group metals comprising a first metal pitch, the second group metals comprising a second metal pitch, and the second metal pitch being 1.2-1.5 times the first metal pitch; and
   a plurality of contact plugs formed on the non-planar FET device, the contact plugs physically contacting the gate electrode of the non-planar FET device and only one of the fins of the non-planar FET device, the contact plugs comprising a contact pitch, and the contact pitch being larger than the fin pitch and larger than the first metal pitch.

2. The integrated circuit structure according to claim 1, wherein the contact plugs electrically connect the non-planar FET device and the first group metals of the interconnection structure.

3. The integrated circuit structure according to claim 1, wherein the first group metals comprise no more than two layers.

4. The integrated circuit structure according to claim 1, wherein the second group metals comprise no more than four layers.

5. The integrated circuit structure according to claim 4, wherein each layer of the second group metals comprises metal structures and via structures.

6. The integrated circuit structure according to claim 1, wherein the first metal pitch is smaller than a predetermined value.

7. The integrated circuit structure according to claim 6, wherein the predetermined value is 75 nanometers (nm).

8. The integrated circuit structure according to claim 7, wherein the second metal pitch is between 75 nm and 85 nm.

9. The integrated circuit structure according to claim 1, further comprising a plurality of third group metals, and the third group metals comprise a third metal pitch.

10. The integrated circuit structure according to claim 9, wherein the first metal pitch is smaller than a first predetermined value, the second metal pitch is larger than the first predetermined value and smaller than a second predetermined value, and the third metal pitch is larger than the second predetermined value.

11. The integrated circuit structure according to claim 10, wherein the first predetermined value is 50 nm and the second predetermined value is 75 nm.

12. The integrated circuit structure according to claim 1, wherein the fins of the non-planar FET device comprise silicon, germanium, or III-V semiconductor material.

13. The integrated circuit structure according to claim 1, wherein the gate electrode of the non-planar FET device comprises a single work function metal layer or a multiple work function metal layer.

\* \* \* \* \*